United States Patent

Anderson et al.

[11] Patent Number: 5,551,982
[45] Date of Patent: Sep. 3, 1996

[54] SEMICONDUCTOR WAFER PROCESS CHAMBER WITH SUSCEPTOR BACK COATING

[75] Inventors: Roger N. Anderson; H. Peter W. Hey, both of San Jose; Israel Beinglass, Sunnyvale; Mahalingam Venkatesan, San Jose, all of Calif.

[73] Assignee: Applied Materials, Inc., Santa Clara, Calif.

[21] Appl. No.: 221,118

[22] Filed: Mar. 31, 1994

[51] Int. Cl.⁶ .................................................. C23C 16/00
[52] U.S. Cl. .......................................... 118/715; 118/725
[58] Field of Search ..................................... 118/715, 725

[56]     References Cited

U.S. PATENT DOCUMENTS

| | | | |
|---|---|---|---|
| 4,290,385 | 11/1981 | Nakanisi | 118/730 |
| 4,913,929 | 4/1990 | Moslechi | 427/39 |
| 5,108,792 | 4/1992 | Anderson | 427/248.1 |
| 5,217,755 | 6/1993 | Thebault | 427/248.1 |
| 5,226,968 | 7/1993 | Ohmi | 118/720 |
| 5,261,960 | 11/1993 | Ozias | 118/719 |
| 5,269,847 | 12/1993 | Anderson et al. | 118/715 |

FOREIGN PATENT DOCUMENTS

| | | |
|---|---|---|
| 9000430 | 3/1990 | European Pat. Off. . |
| 1056273 | 4/1991 | European Pat. Off. . |

*Primary Examiner*—R. Bruce Breneman
*Assistant Examiner*—Jeffrie R. Lund

[57]     ABSTRACT

The present disclosure is directed to an apparatus for depositing a layer of a material on a wafer. The apparatus includes a deposition chamber having an upper dome, a lower dome and a side wall between the upper and lower domes. A susceptor plate is in and extends across the deposition chamber to divide the deposition chamber into an upper portion above the susceptor plate and a lower portion below the susceptor plate. A gas inlet manifold is in the side wall. The manifold has three inlet ports. One of the ports is connected by passages which open into the lower portion of the deposition chamber. The other two ports are connected by passages which open into the upper portion of the deposition chamber. A gas supply system is connected to the inlet ports so as to provide the same gases into the lower portion of the deposition chamber as well as into the upper portion of the deposition chamber. This allows the back surface of the susceptor plate to be coated with a layer of the same material as to be coated on the wafer prior to coating the layer on the wafer.

22 Claims, 5 Drawing Sheets

SEMICONDUCTOR WAFER PROCESS CHAMBER WITH SUSCEPTOR BACK COATING

BACKGROUND OF THE INVENTION

1. Field of the Invention

The present invention relates to a process chamber for semiconductor wafers, and, more particularly, to a method and apparatus for processing semiconductor wafers wherein gases can be supplied to both sides of a susceptor which supports the semiconductor wafer during processing and to different areas of the surface of the semiconductor wafer.

2. Background of the Invention

One type of processing apparatus for semiconductor wafers is a single wafer processor in which one wafer at a time is supported on a susceptor in a processing chamber. The susceptor divides the chamber into one portion which is below the susceptor (the lower portion), and a second portion which is above the susceptor (the upper portion). The susceptor is generally mounted on a shaft which rotates the susceptor about its center to achieve a more uniform processing of the wafer. A flow of a processing gas, such as a deposition gas, is provided in the upper portion of the chamber and across the surface of the wafer. The chamber generally has a gas inlet port at one side thereof, and a gas outlet port at an opposite side to achieve a flow of the processing gas across the wafer. The susceptor is heated in order to heat the wafer to a desired processing temperature. One method used to heat the susceptor is by the use of lamps provided around the chamber and directing their light into the chamber and onto the susceptor. In order to control the temperature to which the wafer is being heated, the temperature of the susceptor is constantly measured. This is often achieved by means of an infrared temperature sensor which detects the infra-red radiation emitted from the heated susceptor.

One problem with this type of processing apparatus is that some of the processing gas, which is often a gas or mixture of gases for depositing a layer of a material on the surface of the wafer, tends to flow around the edge of the susceptor and deposits a layer of the material on the back surface of the susceptor. Since the deposited material is generally different from the material of the susceptor, the deposited layer has an emissivity which is different from that of the emissivity of the susceptor. Thus, once the layer of the material is deposited on the back surface of the susceptor, the infrared temperature sensor detects a change caused by the change in the emissivity of the surface from which the infra-red radiation is emitted. This change indicates a change in temperature of the susceptor which actually does not exist.

One technique which has been used to prevent the problem of deposits on the back surface of the susceptor is to provide a flow of an inert gas, such as hydrogen, into the lower portion of the chamber at a pressure slightly greater than that of the deposition gas in the upper portion of the chamber. One apparatus for achieving this is described in the application for U.S. Patent of ! Roger Anderson et al., Ser. No. 08/099,977, filed Jul. 30, 1993, now abandoned, entitled "Gas Inlets For Wafer Processing Chamber". Since the inert gas in the lower portion of the chamber is at a higher pressure, it will flow around the edge of the susceptor from the lower portion of the chamber into the upper portion of the chamber. This flow of the inert gas prevents the flow of the deposition gas into the lower portion of the chamber. Although this is very satisfactory for preventing deposition of a layer from the deposition gas on the back surface of the susceptor, it does have a disadvantage. The flow of the inert gas into the upper portion of the chamber at the edge of the susceptor dilutes the deposition gases at the edge of the susceptor. This, in turn, causes a non-uniformity of the composition of the deposition gas so as to adversely affect both the thickness and resistivity uniformity of the layer being deposited.

Another technique which has been developed to limit the flow of inert gas around the edge of the susceptor from the lower portion of the chamber to the upper portion of the chamber is to overlap the edge of the susceptor with a preheat ring which surrounds the susceptor. This forms a labyrinth passage which greatly reduces the flow of gases around the edge of the susceptor. Such an apparatus is described in the application for U.S. Patent of Israel Beinglass, Ser. No. 08/090,591, filed Jul. 13, 1993, now abandoned, entitled "Improved Susceptor Design". Although this reduces the flow of gases around the edge of the susceptor, it has a disadvantage that the susceptor and preheat ring must be aligned very accurately so that the gap therebetween is small enough to prevent flow of the processing gas therethrough, but large enough so that the susceptor does not scrape or rub on the preheat ring. If the susceptor scrapes or rubs against the preheat ring, it would cause the formation of particles which can contaminate the layer being deposited, or cause mechanical damage to the susceptor. This spacing between the susceptor and preheat ring is difficult to maintain because of the mechanical tolerance stack-up of parts and because of other factors, such as thermal expansion or wear-in.

Therefore, it would be desirable to have a method and apparatus which overcomes the problem of improper indication of temperature resulting from a coating applied to the back surface of the susceptor. Also, it would be desirable to have an apparatus which overcomes the problem of dilution of the deposition gases by the flow of inert gas around the susceptor form the lower portion of the chamber.

SUMMARY OF THE INVENTION

One aspect of the present invention is directed to a susceptor for an apparatus for depositing a layer of a material on a wafer. The susceptor is a plate having a surface for supporting a wafer and a back surface opposite the wafer supporting surface. A layer of a material to be deposited on the wafer is on the back surface of the susceptor plate.

Another aspect of the present invention is directed to an apparatus for depositing a layer of a material on a surface of a wafer. The apparatus includes a deposition chamber and a susceptor plate extending across the chamber and having a top surface for supporting a wafer and a back surface opposite the top surface. A layer of the material to be deposited on the wafer is on the back surface of the susceptor plate.

A further aspect of the present invention is directed to a method of depositing a layer of a material on a surface of a wafer mounted on the top surface of a susceptor in a deposition chamber. The method includes the step of depositing a layer of the same material to be deposited on the wafer on the back surface of the susceptor.

Still another aspect of the present invention is directed to a deposition apparatus for depositing a layer of a material on a wafer. The apparatus includes a deposition chamber having an outer wall. A susceptor plate is within the chamber and extends across the chamber to divide the chamber into an upper portion which is above the top surface of the susceptor plate on which the wafer is supported, and a lower portion which is below the back surface of the susceptor plate. A gas inlet manifold is in the wall of the chamber. The gas inlet manifold includes at least one passage opening into the lower portion of the chamber and at least one passage opening into the upper portion of the chamber.

DETAILED DESCRIPTION

Figure 1:
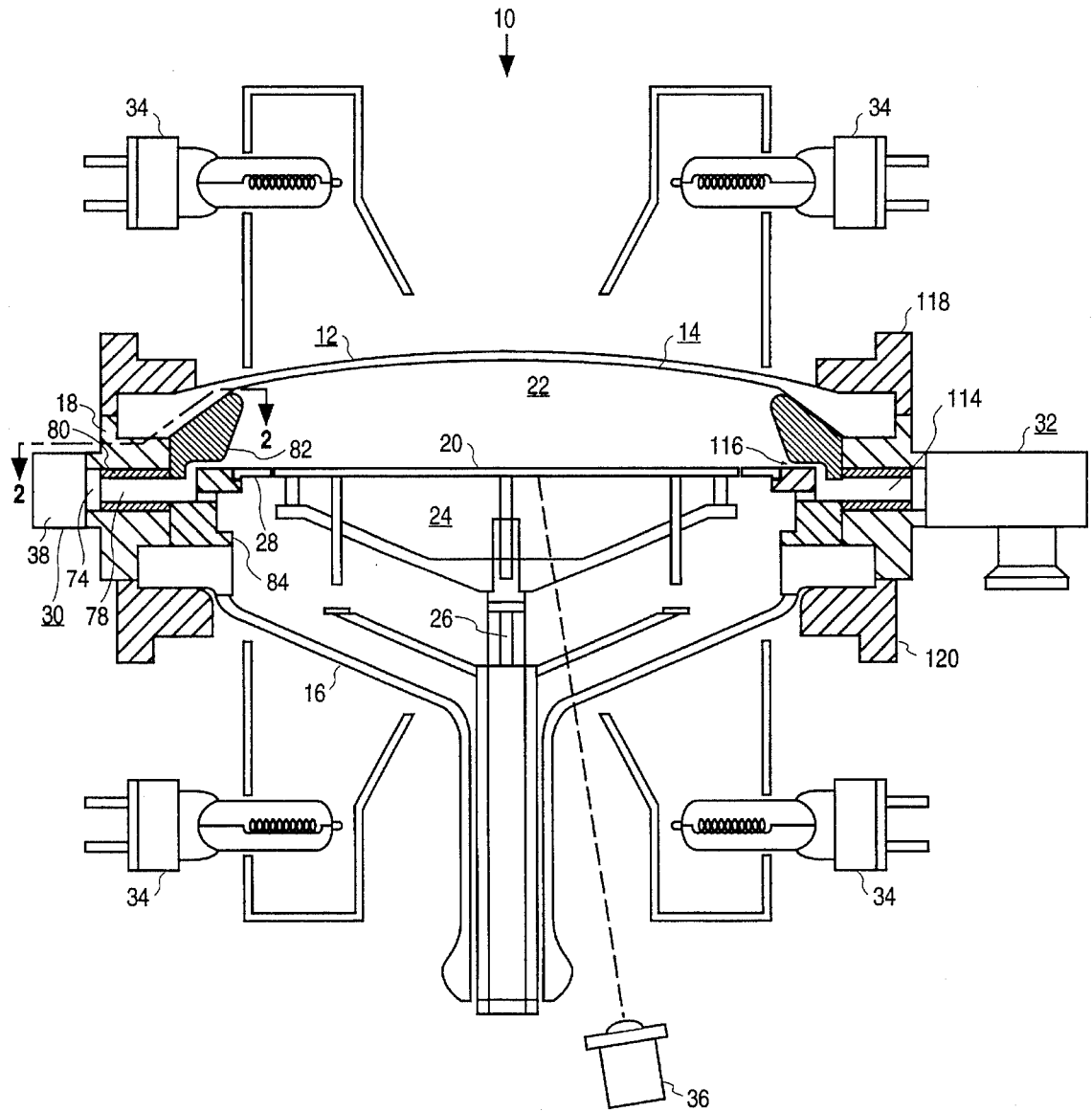
FIG. 1 is a sectional view of a semiconductor wafer processing apparatus in accordance with the present invention.

Referring initially to FIG. 1, a semiconductor wafer processing apparatus in accordance with the present invention is generally designated as 10. The processing apparatus 10 shown is a deposition reactor and comprises a deposition chamber 12 having an upper dome 14, a lower dome 16 and a side wall 18 between the upper and lower domes 14 and 16. The upper and lower domes 14 and 16 are made of a transparent material to allow heating light to pass therethrough into the chamber 12. Within the chamber 12 is a flat, circular susceptor 20. The susceptor 20 extends transversely across the chamber 12 at the side wall 18 to divide the chamber 12 into an upper portion 22 above the susceptor 20 and a lower portion 24 below the susceptor 20. The susceptor 20 is mounted on a shaft 26 which extends perpendicularly downwardly from the center of the bottom of the susceptor 20. The shaft 26 is connected to a motor (not shown) which rotates the shaft and thereby rotates the susceptor. An annular preheat ring 28 is connected at its outer periphery to the side wall 18 and extends around the susceptor 20. The pre-heat ring 28 is in the same plane as the susceptor 28 with the inner edge of the pre-heat ring 28 being close to the outer edge of the susceptor 20. An inlet manifold 30 in accordance with the present invention is in the side wall 18 and is adapted to admit processing gases into the chamber 12. An outlet port 32 is in the side wall 18 diagonally opposite the inlet manifold and is adapted to exhaust gases from the deposition chamber 12.

A plurality of high intensity lamps 34 are mounted around the chamber 12 and direct their light through the upper and lower domes 14 and 16 onto the susceptor 20 to heat the susceptor 20. The upper and lower domes 14 and 16 are made of a material which is transparent to the light from the lamps 34, such as clear quartz. The upper and lower domes 14 and 16 are generally made of quartz because quartz is transparent to light of both visible and IR frequencies; it exhibits a relatively high structural strength; and it is chemically stable in the process environment of the deposition chamber 12. An infrared temperature sensor 36 is mounted below the lower dome 16 and faces the bottom surface of the susceptor 20 through the lower dome 16. The temperature sensor 36 is used to monitor the temperature of the susceptor 20 by receiving infra-red radiation emitted from the susceptor 20 when the susceptor 20 is heated.

Figure 2:
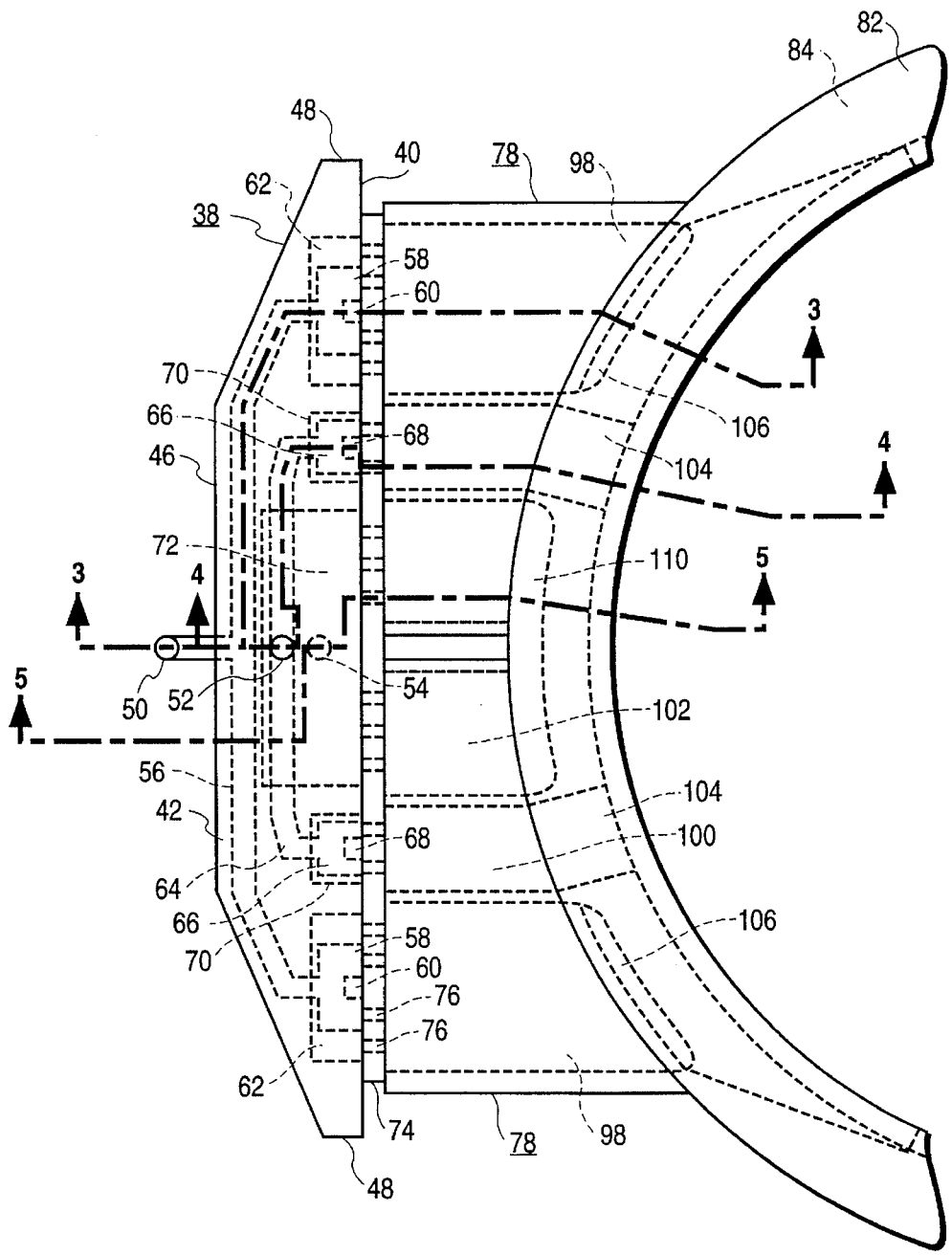
FIG. 2 is a sectional view taken along line 2—2 of FIG. 1.
Figure 6:
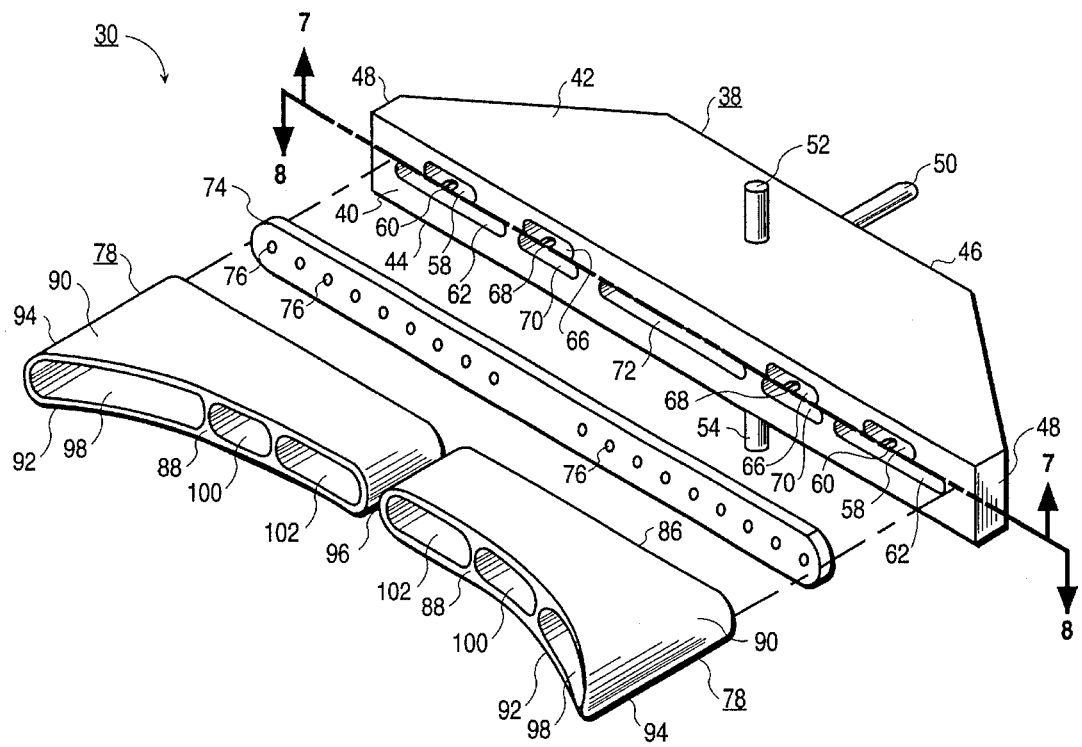
FIG. 6 is an exploded perspective view of the gas inlet manifold in accordance with the present invention.
Figure 7:
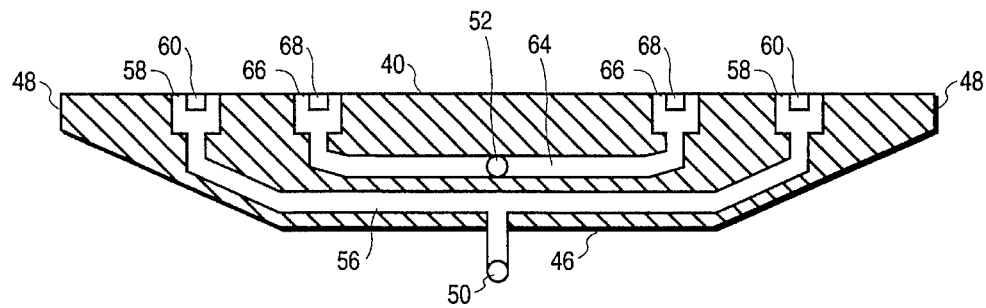
FIG. 7 is a sectional view taken along line 7—7 of FIG. 6.
Figure 8:
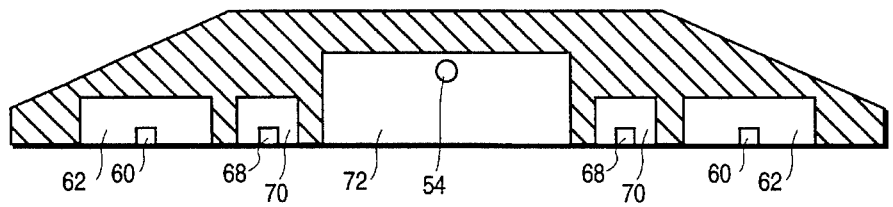
FIG. 8 is a sectional view taken along line 8—8 of FIG. 6.

As shown in FIGS. 2 and 6, inlet manifold 30 comprises a flat cap plate 38 having a rectangular front surface 40, flat top and bottom surfaces 42 and 44 respectively, a back surface 46, and end surfaces 48. Three inlet ports 50, 52 and 54 extend into the plate 38 intermediate the ends 48 of the plate 38 at the back surface 46, top surface 42, and bottom surface 44 of the plate 38 respectively. As shown in FIG. 7, the back inlet port 50 opens into a passage 56 which extends along the back surface 46 to upper, outer chambers 58 adjacent the ends 48 of the cap plate 38. As shown in FIGS. 6, 7 and 8, the upper, outer chambers 58 open to the front surface 40 and are elongated in the direction of the width of the front surface 40. Passages 60 extend downwardly from the upper, outer chambers 58 to lower, outer chambers 62 which are below the chambers 58. The lower, outer chambers 62 open to the front surface 40 and are elongated in the direction of the width of the front surface 40. Lower, outer chambers 62 are wider than the upper, outer chambers 58.

The top inlet port 52 opens into a passage 64 which is spaced from and extends substantially parallel to the passage 56. Passage 64 extends to upper, middle chambers 66 which are adjacent but spaced inwardly from the upper, outer chambers 58. The upper, middle chambers 66 open to the front surface 40 and are elongated in the direction of the width of the front surface 40. Passages 68 extend downwardly from the upper, middle chambers 66 to lower, middle chambers 70 which are below the upper middle chambers 66. The lower middle chambers 70 open to the front surface 40 and are elongated in the direction of the width of the front surface 40. The upper, middle chambers 66 are about the same width as the upper, outer chambers 58, and the lower, middle chambers 70 are slightly wider than the upper, middle chambers 66. The upper, middle chambers 66 are in the same plane as the upper, outer chambers 58, and the lower, middle chambers 70 are in the same plane as the lower, outer chambers 62.

The bottom inlet port 54 extends into a relatively large inner chamber 72 which is between the lower, middle chambers 70. The inner chamber 72 opens onto the front surface 40 and is elongated in the direction of the width of the front surface 40. The inner chamber 72 is in the same plane as the lower outer chambers 62 and the lower, middle chambers 70, but is much wider than the lower outer chambers 62 and the lower, middle chambers 70. Thus, all of the chambers 58, 62, 66, 70 and 72 open onto the front surface 40 of the plate 38 and are all elongated in the direction of the width of the front surface 40. The upper chambers 58 and 66 are in the same plane with the upper middle chambers 66 being between the upper, outer chambers 58. The lower chambers 62, 70 and 72 are all in the same plane below the plane of the upper chambers 58 and 66, with the lower, middle chambers 70 being between the lower, outer chambers 62, and the inner chamber 72 being between the lower, middle chambers 70.

A baffle plate 74 extends across the front surface 40 of the cap plate 38. Baffle plate 74 is rectangular to match the size and shape of the front surface 40. A plurality of holes 76 extend through the baffle plate 74 and are arranged along a common plane. The plane of the holes 76 corresponds to the plane of the lower chambers 62, 70 and 72 in the cap plate 38. However, the baffle plate 74 is solid over the upper chambers 58 and 66 so as to cover the open side of the upper chambers 58 and 66. Four of the holes 76 at each end of the line of holes 76 are over the open side of each of the lower, outer chambers 62, two of the holes 76 are over the open side of each of the lower, middle chambers 70 and six of the holes at the center of the line are over the inner chamber 72. Thus, any gas entering the lower chambers 62, 70 and 72 can flow across the baffle plate 74 through the holes 76.

The cap plate 38 and baffle plate 74 are seated against a pair of insert plates 78 which extend through an opening 80 in the side wall 18 to upper and lower liners 82 and 84 respectively. The liners 82 and 84 are mounted against the inside surface of the side wall 18. Each of the insert plates 78 has a substantially rectangular back surface 86, a curved front surface 88, flat top and bottom surfaces 90 and 92 respectively and straight end surfaces 94 and 96 respectively. The curved front surfaces 88 are along a portion of a circle. Thus, the outer end surfaces 94 of each of the insert plates 78 are longer than the inner end surfaces 96. The insert plates 78 are positioned with the inner end surfaces 96 being adjacent and facing each other. Three spaced, parallel passages 98, 100 and 102 extend through each of the insert plates 78 from the flat back surface 86 to the curved front surface 88. The outer passages 98 extend along the outer end surface 94, the inner passages 102 extend along the inner end surfaces 96 and the middle passages 100 are between the outer and inner passages 98 and 102. The passages 98, 100 and 102 are each substantially rectangular in cross-section and are elongated in the direction of the width of the back surface 86 of the insert plates 78. The outer passages 98 are of the same width as the lower, outer chambers 62 in the cap plate 38, the middle passages 100 are of the same width as the lower, middle chambers 70 in the cap plate 38 and the inner passages 102 have a combined width substantially equal the width of the inner chamber 72 in the cap plate 38. The passages 98, 100 and 102 are aligned with the holes 76 in the baffle plate 74. Thus, gas from the lower, outer chambers 62 in the insert plate 38 will flow through the outer four holes 76 into the outer passages 98; gas from the lower, middle chambers 70 will flow through two holes 76 into the middle passages 100; and gas from the inner chamber 72 will flow through six of the holes into the inner passages 102.

Figure 4:
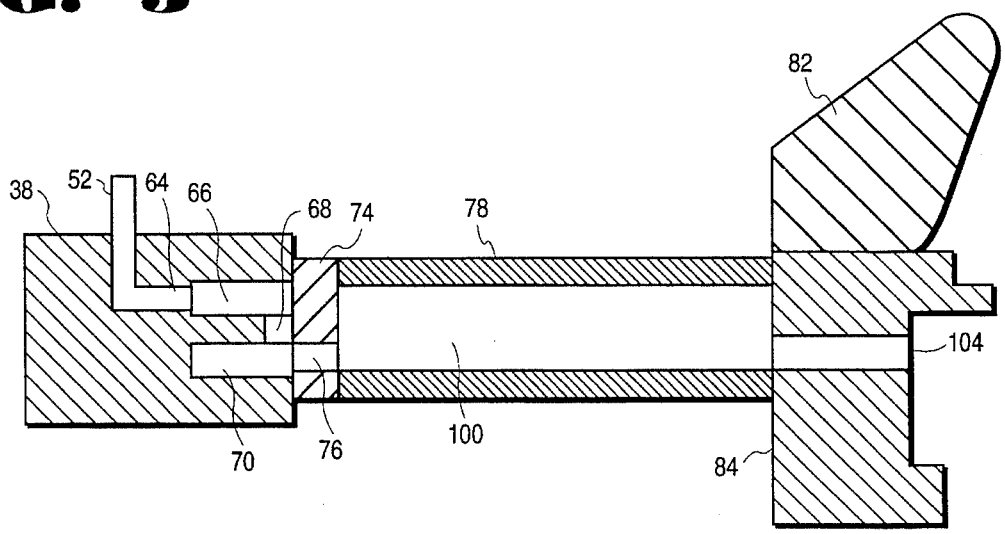
FIG. 4 is a sectional view taken along line 4—4 of FIG. 2.

The curved front surfaces 88 of the insert plates 78 are seated against the curved outer surface of the lower liner 84. As shown in FIGS. 2 and 4, the lower liner 84 has a pair of middle passages 104 which extends therethrough from the middle passages 100 of the insert plates 78. The middle passages 104 open into the lower portion 24 of the deposition chamber 12 beneath the susceptor 20. Thus, gases from the lower, middle chambers 70 will flow through the middle passages 100 in the insert plates 78, and the middle passages 104 in the lower line 84 into the lower portion 24 of the deposition chamber 12 beneath the susceptor 20.

Figure 3:
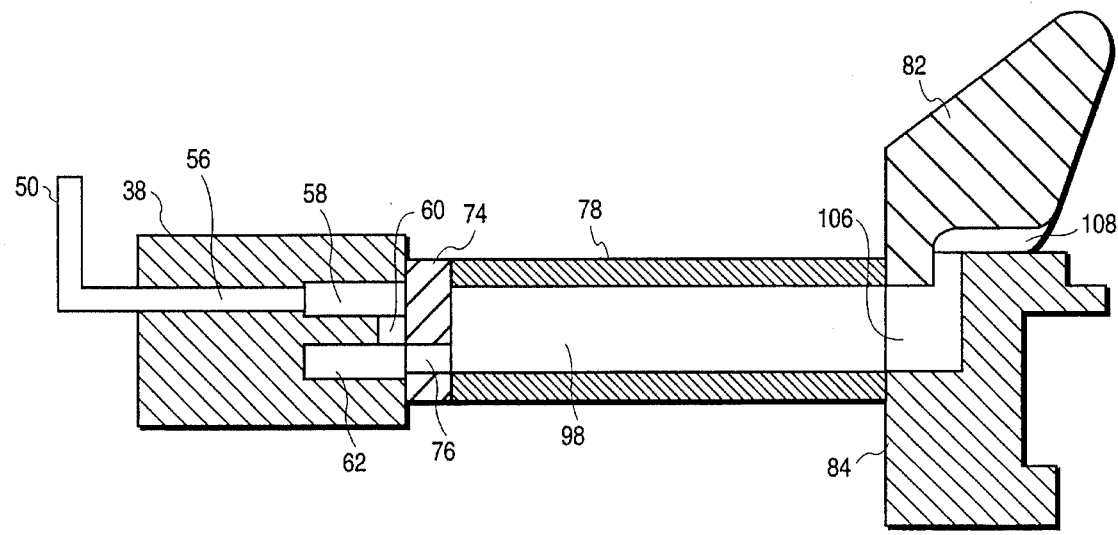
FIG. 3 is a sectional view taken along line 3—3 of FIG. 2.

The lower liner 84 has a separate outer recess 106 in its outer surface facing each of the outer passages 98 in the insert plates 78. As shown in FIGS. 2 and 3, the outer recesses 106 extend upwardly along the outer surface of the lower liner 84 to an outer passage 108 which extends between the lower liner 84 and the upper liner 82 to the upper portion 22 of the deposition chamber 12 above the susceptor 20. Thus, gases from the outer passages 98 will flow through the outer recesses 106 and outer passages 108 into the upper portion 22 of the deposition chamber 12 over the upper surface of the susceptor 20.

Figure 5:
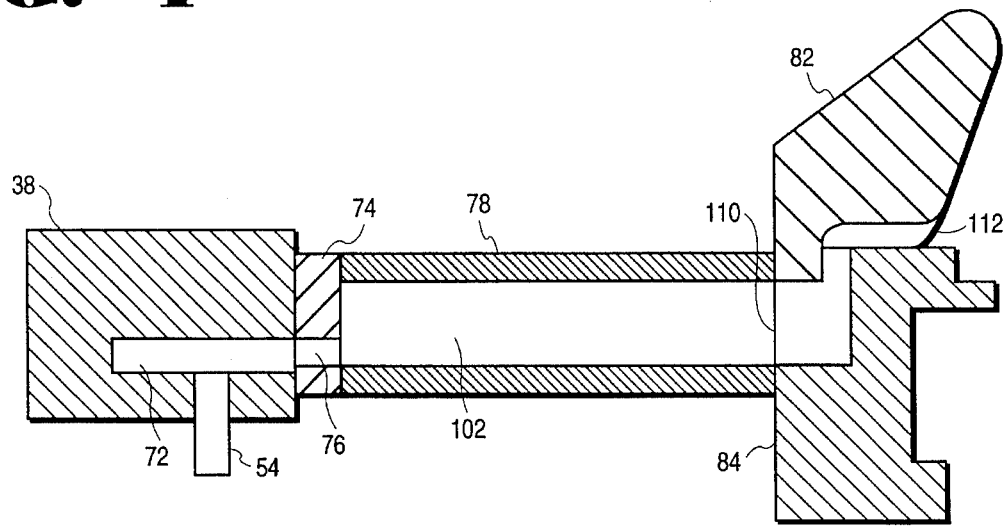
FIG. 5 is a sectional view taken along line 5—5 of FIG. 2.

The lower liner 84 has an inner recess 110 in its outer surface facing both of the inner passages 102 in the insert plates 78. As shown in FIGS. 2 and 5, the inner recess 110 extends upwardly along the outer surface of the lower liner 84 to an inner passage 112 which extends between the lower liner 84 and the upper liner 82 to the upper portion 22 of the deposition chamber 12 above the susceptor 20. Thus, gases from the inner passages 102 will flow through the inner recess 110 and inner passage 112 into the upper portion 22 of the deposition chamber 12 and over the upper surface of the susceptor 20. The inner passage 112 is between the outer passages 108, and is positioned to direct gases passing therethrough substantially diametrically across the center portion of the susceptor 20. The outer passages 108 are positioned to direct gases passing therethrough across the outer portions of the susceptor 20.

Substantially diagonally across the susceptor 20 opposite the middle passage 104, the lower liner 84 has an exhaust passage 114 therethrough from the outlet pipe 32, as shown in FIG. 1. The exhaust passage 114 opens to an outlet passage 116 which is between the lower liner 84 and upper liner 82 and opens into the upper portion 22 of the deposition chamber 12. Thus, gases in the deposition chamber 12 flow therefrom through the outlet passage 116 and exhaust passage 114 to the outlet pipe 32 to exhaust the deposition chamber 12. Gases in the upper portion 22 of the deposition chamber 12 are exhausted by flowing directly through the exhaust passage 114, outlet passage 116 and outlet pipe 32. Gases in the lower portion 24 of the deposition chamber 12 are exhausted by flowing around the edge of the susceptor 20 into the upper chamber 22 and then flowing through the exhaust passage 114, outlet passage 116 and outlet pipe 32.

An upper clamping ring 118 extends around the periphery of the outer surface of the upper dome 14. A lower clamping ring 120 extends around the periphery of the outer surface of the lower dome 16. The upper and lower clamping rings 118 and 120 are secured together so as to clamp the upper and lower domes 14 and 16 to the side wall 18.

Figure 9:
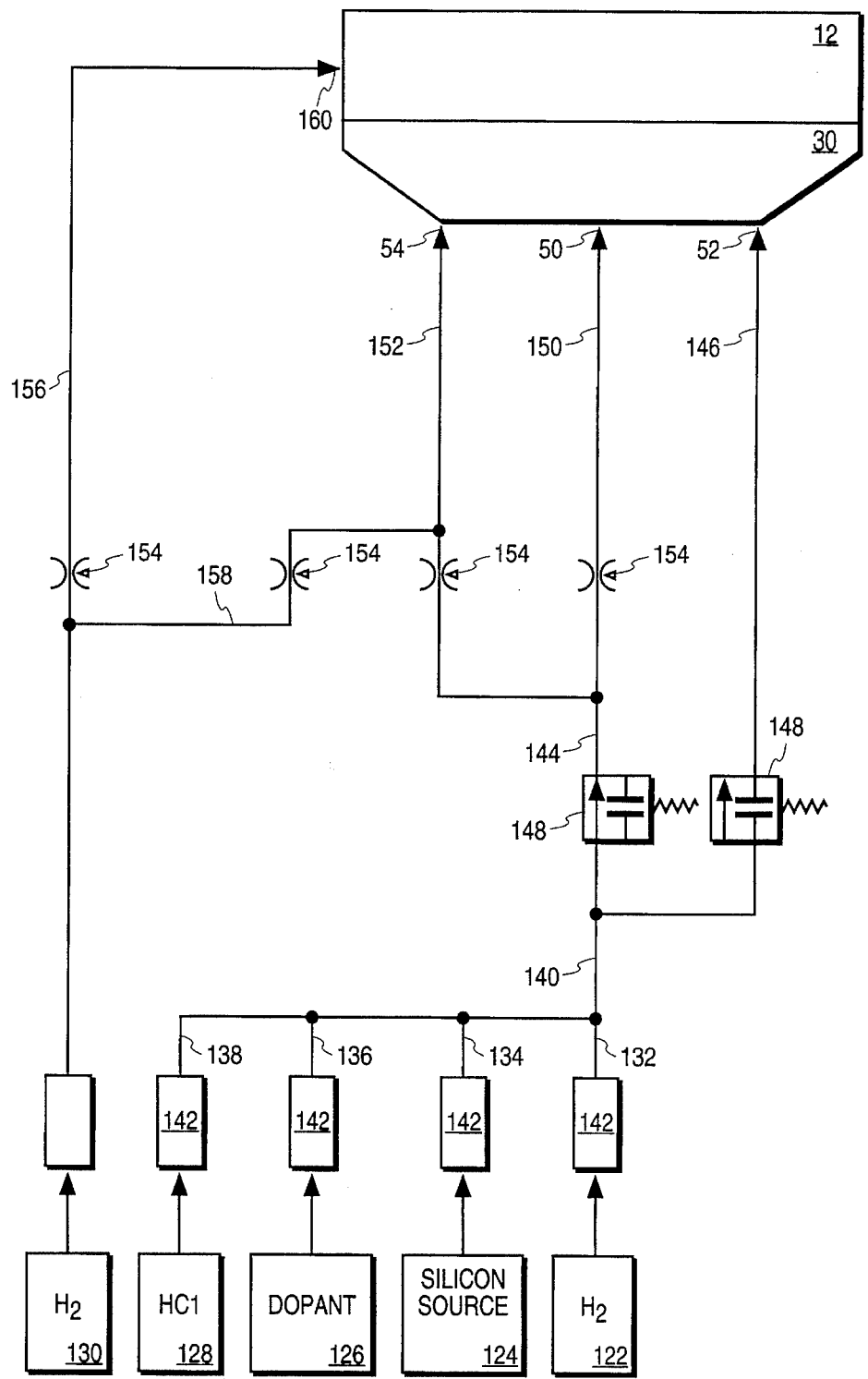
FIG. 9 is a schematic view of the gas supply system for the processing apparatus of the present invention.

Referring to FIG. 9, there is schematically shown a gas supply system for the apparatus 10 of the present invention. The gas supply system comprises a plurality of sources of various gases to be used in the processing to be carried out in the chamber 12. In the system shown, there are five sources of gas 122, 124, 126, 128 and 130. Source 122 may be a source of a carrier gas which is relatively inert in this context, such as hydrogen. Source 124 may be a source of a deposition gas, such as silane for depositing a silicon containing material. Source 126 may ! be a source of a dopant for doping the material to be deposited. Source 128 may be a source of hydrogen chloride. Source 130 may be a purge gas, such as hydrogen, for purging the lower portion 24 of the chamber 12.

The gas sources 122, 124, 126 and 128 are connected by individual lines 132, 134, 136 and 138 respectively to a common line 140. Each of the lines 132, 134, 136 and 138 has a flow metering control valve 142 therein to control the flow of its respective gas to the common line 140. Common line 140 is connected to a line 144 for the upper portion 22 of the chamber 12 and a line 146 for the lower portion 24 of the chamber 12. Each of the lines 144 and 146 has a valve 148 therein for turning off and on the flow through the respective line. The upper portion line 144 is connected to a line 150 which extends to the inlet port 50 of the inlet manifold 30, and to a line 152 which extend to the inlet port 54 of the inlet manifold 30. Each of the lines 150 and 152 has a control valve 154 therein to control the flow of the gases to the respective inlet ports. The lower portion line 146 is connected to the inlet port 52 of the inlet manifold 30. The gas source 130 is connected by a line 156 to a separate inlet port 160 which flows into the lower portion 24 of the deposition chamber 12. A line 158 extends from the line 156 to the line 152 which is connected to the inlet port 54. Control valves 154 are also provided in the lines 156 and 158.

In the operation of the apparatus 10 for depositing a layer of a material on the surface of a wafer, an initial step is to coat the under or back surface of the susceptor 20 with a layer of the same material that is to be coated on the surface of the wafer. For example, if a layer of doped silicon is to be deposited on the surface of the wafer, the same doped silicon is first deposited on the back surface of the susceptor 20. This is achieved by providing a flow of a silicon containing gas, such as silane, from the source 124, a dopant gas from the source 126 and a carrier gas, such as hydrogen, from the source 122. The flows of the gases are controlled by the flow controllers 142 to provide the desired mixture of the gases. The valve 148 in the line 144 to the upper portion 22 of the deposition chamber 12 is closed, and the valve 148 in the line 146 to the lower portion 24 of the deposition chamber 12 is opened. Thus, the gas mixture flows through the line 146 into the inlet port 52. The gas mixture then flows through the passage 64 into the upper, middle chamber 66; down the passage 68 into the lower, middle chamber 70, through the holes 76 in the baffle plate 74, through the middle passages 100 in the insert plates 78 and through the middle passages 104 in the lower liner 84 into the lower portion 24 of the deposition chamber 12. The gases then flow across the bottom surface of the susceptor 20 which is being heated by the lamps 34. The heated susceptor 20 heats the gases causing them to react and deposit a layer of doped silicon on the back surface of the susceptor 20.

The purpose of coating the back surface of the susceptor 20 with a layer of the same material which is to be coated on a wafer is to provide for good and accurate control of the temperature of the susceptor 20 during the time that the material is being coated on the wafer. During the deposition of the material on the surface of the wafer, some of the deposition gases in the upper portion 14 of the deposition chamber 12 will leak between the susceptor 20 and the pre-heat ring 28 and will flow into the lower portion 24 of the deposition chamber 12. Such leaking gases will contact the back surface of the susceptor 20 and will deposit a layer of the material on the back surface of the susceptor 20. During this deposition process, the temperature of the susceptor 20 is being monitored by the temperature sensor 36. A factor which affects the reading of the temperature sensor 36 is the emissivity of the susceptor 20. The emissivity of the material being deposited on the susceptor 20 is different from that of the material of the susceptor 20 itself. Thus, if a layer of the material being deposited on the wafer is also deposited on the back surface of the susceptor 20, the temperature sensor 36 will see a difference in emissivity and will indicate a change in temperature even though the temperature of the susceptor 20 has not changed. However, by first coating the back surface of the susceptor 20 with a layer of the material being coated on the wafer, the temperature sensor 36 is initially calibrated to the emissivity of the coated layer. Thus, during the deposition of the material on the wafer, if some of the same material is coated on the back surface of the susceptor 20, it is coated over a layer of a material having the same emissivity. Thus, the temperature sensor 36 sees the same emissivity and there is no change in the indication of the temperature of the susceptor 20 as a result of the additional coating deposited on the back surface of the susceptor 20. Therefore, only changes in the actual temperature of the susceptor 20 will be indicated by the temperature sensor 36, and not false indications of changes as a result of a material being coated in the back surface of the susceptor 20.

In order to be sure that the beam from the temperature sensor 36 does not pass through the coated layer and contact the susceptor 20, it is desirable that the coated layer be of a thickness of approximately 6 microns. Depositing silicon from a silane gas is relatively slow and can take a relatively long time to deposit such a thick coating on the back surface of the susceptor 20. To shorten the time needed to deposit a suitable layer on the back surface of the susceptor 20, an initial coating of silicon can be deposited on the back surface of the susceptor 20 using a dichlorosilane as the source of the silicon. Dichlorosilane provides a much faster deposition of silicon. Using the dichlorosilane as the deposition gas, a layer of silicon of a thickness of about 4 microns or more can be initially deposited on the back surface of the susceptor 20. Then a final layer of silicon of about 2 microns can then be deposited using the same silane gas which is to be used to deposit a layer on the wafers. If dichlorosilane is used for initially coating the back surface of the susceptor 20, the gas supply system shown in FIG. 9 would have to be provided with an additional gas source for the dichlorosilane.

Prior to coating the back surface of the susceptor 20 with the layer of the same material to be coated on the wafers, it may be desirable to clean the surfaces of the susceptor 20 by removing any previous coatings on the surfaces thereof. This is achieved by admitting the hydrogen chloride from the gas source 128 into the chamber 12. The hydrogen chloride could be admitted into both the upper and lower portions 22 and 24 of the deposition chamber 12 so as to contact both surfaces of the susceptor 20. The susceptor 20 is heated to a relatively high temperature, about 1200° C. The hydrogen chloride will then etch away any previous coatings on the surfaces of the heated susceptor 20.

After the back surface of the susceptor 20 is coated with the same material as to be coated on the wafers, individual wafers are feed one at a time into the upper portion 22 of the deposition chamber 12 and onto the upper surface of the susceptor 20. The wafers are fed into the deposition chamber 12 through a suitable door, not shown. A layer of the material, such as doped silicon, is then coated on the individual wafers. This is achieved by closing the valve 148 in the line 146 to the lower portion 24 of the deposition chamber 12, and opening the valve 148 in the line 144 to the upper portion 22 of the deposition chamber 12. The gases then flow through the lines 150 and 152 to the back and bottom inlet ports 50 and 54 in the inlet manifold 30. The gases entering through the back inlet port 50 flows through the passage 56 into the upper, outer chamber 58; down the passage 60 into the lower, outer chamber 62; through the holes 76 in the baffle plate 74; and into the outer passages 98 in the insert plates 78. The gases then flow through the outer recesses 106 and Outer passages 108 into the upper portion 22 of the deposition chamber 12 and across the outer portion of the wafer on the susceptor 20. The gases entering through the bottom inlet port 54 passes through the inner chamber 72; through the holes 78 in the baffle plate 74; and into the inner passages 102 in the insert plates 78. The gases then flow through the inner recess 110 in the lower liner 84 and through the inner passage 112 into the upper portion 22 of the deposition chamber 12 and across the center portion of the wafer on the susceptor 20. The susceptor 20 and wafer are heated by the lamps 34 to a temperature at which the gases passing over the wafer are reacted to deposit a layer of the material on the surface of the wafer. The exhaust gases then pass through the passages 114 and 116 to the outlet pipe 32. Thus, a layer of the desired material is deposited on the wafer.

During the deposition of the layer on the surface of the wafer, it is generally desirable to provide a flow of an inert purge gas, such as hydrogen, into the lower portion 24 of the deposition chamber 12 at a pressure slightly greater than the pressure of the gases in the upper portion 22 of the chamber 12. The purge gas will seep between the susceptor 20 and the pre-heat ring 28 and flow into the upper portion 22 of the deposition chamber 12. This limits the flow of the deposition gases from the upper portion 22 to the lower portion 24 of the deposition chamber 12. In the apparatus 10 of the present invention, this is achieved by providing a flow of hydrogen from the hydrogen source 130 through the line 156 into the inlet port 160.

However, a problem with having the hydrogen gas flow around the edge of the susceptor 20 from the lower portion 24 to the upper portion 22 of the deposition chamber 12 is that the hydrogen then flows across the peripheral portion of the surface of the wafer on which the layer is being deposited. This additional hydrogen dilutes the mixture of the deposition gases around the peripheral portion of the wafer. Since the composition of the deposition gas around the peripheral portion of the wafer is then different from that of the deposition gases across the center portion of the wafer, the layer of the material deposited on the wafer is not uniform across the entire surface of the wafer.

In the apparatus 10 of the present invention, this problem is overcome by providing a flow of the hydrogen purge gas through the line 158 into the line 152 which feeds the deposition gas into the bottom inlet port 54. Thus, the deposition gas being feed into the bottom inlet port 54 becomes more diluted with the hydrogen gas. As previously described, the gas being feed into the bottom inlet port 54 flows into the upper portion 22 of the deposition chamber 12 across the center of the susceptor 20. Thus, the deposition gas now flowing across the center of the wafer is more diluted with hydrogen than the deposition gas entering the deposition chamber 12 which is flowing across the outer portion of the wafer. However, since the deposition gas flowing across the outer portion of the wafer is being diluted with hydrogen flowing upwardly across the edge of the susceptor 20 from the lower portion 24 of the deposition chamber 12, the deposition gases flowing across both the center portion and the outer portion of the wafer can be controlled to be of substantially the same composition. Thus, the layer of the material deposited on the surface of the wafer will be substantially uniform across the entire surface of the wafer.

Thus, there is provided by the present invention a deposition apparatus for semiconductor wafers in which prior to depositing a layer of a material on a wafer, the back surface of the susceptor which supports the wafer during deposition is coated with a layer of the same material and dopant level as that to be deposited on the wafer. This provides the back surface of the susceptor with an emissivity which does not change during the deposition process as a result of material being deposited thereof from the deposition gas leaking into the lower portion 24 of the deposition chamber 12. This, in turn, permits the monitoring of the temperature of the susceptor with an infrared temperature sensor without causing a false change in the temperature detected as a result of a change in the emissivity of the back surface of the susceptor 20.

The apparatus 10 of the present invention also has an inlet manifold 30 which can provide the same deposition gases into either the lower portion 24 of the deposition chamber 12 or the upper portion 22 of the deposition chamber 12 so as to allow for a deposition of the same material on either the back surface of the susceptor 20 or on a wafer on the top surface of the susceptor 20. In addition, the inlet manifold 30 provides separate flows of the deposition gas across the center portion of the susceptor 20 and a wafer thereon, and across the outer portions of the susceptor 20 and the wafer. This allows for the control of the composition of the deposition gas being feed across the center of the wafer so that it can be made substantially the same as that flowing across the outer portion of the wafer even if the gas flowing across the outer portion of the wafer is changed by purge gas flowing upwardly across the edge of the susceptor from the lower portion 24 of the chamber 12.

Furthermore, the apparatus 10 of the present invention includes means for providing a flow of an inert purge gas into the lower portion 24 of the deposition chamber 12 during the deposition operation. This allows for a minimizing of the flow of the deposition gas from the upper portion 22 of the deposition chamber 12 into the lower portion 24 during the deposition operation. The apparatus 10 of the present invention also includes means for providing some of the purge gas into the portion of the deposition gas being feed into the upper portion 22 of the deposition chamber 12 across the center of the wafer to control the composition of the deposition gas and make it substantially the same as the composition of the deposition gas flowing across the outer portion of the wafer.

It is to be appreciated and understood that the specific embodiments of the invention are merely illustrative of the general principles of the invention. Various modifications may be made consistent with the principles set forth. For example, the gas outlet port may be connected to passages through the liners which extend to both the lower and upper passages to permit faster exhausting of gases from both portions of the chamber. Also, the inlet manifold may have only one passage to the lower portion of the deposition chamber and only one passage opening across the outer portion of the susceptor in the upper portion of the deposition chamber.

What is claimed is:

1. A deposition apparatus for depositing a layer of material on a wafer, comprising:

a deposition chamber having an outer wall;

a susceptor plate within said chamber, said susceptor plate extending across said chamber to divide said chamber into an upper portion which is above the top surface of the susceptor plate on which the wafer is supported and a lower position which is below the back surface of the susceptor plate; and a gas inlet manifold in the wall of the chamber, said gas inlet manifold having at least one passage opening to direct a deposition gas into said lower portion of said deposition chamber and at least one passage opening to direct said deposition gas into said upper portion of said deposition chamber.

2. The apparatus of claim 1 in which the manifold has at least two passages opening into the upper portion of the deposition chamber, one of said passages being positioned to direct a flow of gas across the center portion of the top surface of the susceptor plate and the other passage being positioned to direct a flow of gas across the peripheral edge portion of the top surface of the susceptor plate.

3. The apparatus of claim 2 in which the deposition chamber comprises an upper dome, a lower dome and a side wall between the upper and lower domes, and the manifold is in the side wall.

4. The apparatus of claim 3 in which the manifold includes a cap plate having three inlet ports, one of said inlet ports being connected to the passage which opens into the lower portion of the chamber, and each of the other two inlet ports being connected to a separate one of the passages which open into the upper portion of the chamber.

5. The apparatus of claim 4 further comprising an insert plate extending through the side wall of the chamber said insert plate having three passages extending therethrough, each of said passages being connected to a separate one of the inlet ports in the cap plate.

6. The apparatus of claim 5 further comprising a liner seated against the inner surface of the side wall of the chamber and extending across a surface of the insert plate, said liner having separate passages extending therethrough opening to each of the passages in the insert plate, one of the passages in the liner opening into the lower portion of the deposition chamber and the other passages in the liner opening into the upper portion of the deposition chamber.

7. The apparatus of claim 6 in which the cap plate has a surface facing a surface of the insert plate, a plurality of recesses are in said surface of the cap plate with each recess being opposed and opening to a separate one of the passages in the insert plate, each of the inlet ports being connected to a separate one of the recesses in the cap plate.

8. The apparatus of claim 4 further comprising a gas supply system connected to each of the inlet ports and adapted to supply said deposition gas to each of the inlet ports.

9. The apparatus of claim 8 in which the gas supply system comprises a plurality of sources of various gases to be included in the deposition gas, and lines connecting each of said gas sources to each of the inlet ports.

10. The apparatus of claim 9 in which the gas sources are all connected to a first common line, a second line connects the common line to the port for feeding gases into the lower portion of the chamber, a separate third line connects the common line to the ports for feeding gas into the upper portion of the chamber, and a separate valve in each of the second and third lines for controlling the flow of gas in each of the second and third lines.

11. The apparatus of claim 10 in which the third line has separate lines connected to each of the inlet ports which are connected to the upper portion of the chamber.

12. The apparatus of claim 11 in which the gas supply system has a separate source of a purge gas and a line connecting the purge gas source to an inlet port connected to the lower portion of the chamber.

13. The apparatus of claim 12 further comprising a line extending from the purge gas source to the inlet port which is connected to the upper portion of the chamber.

14. A gas supply apparatus for providing a flow of process gas to the interior of a semiconductor processing chamber, comprising:

a chamber having a wall defining a processing region;

a substrate support member locatable in said processing region and separating said processing region into a first region and a second region;

a gas manifold, said manifold including at least a first, a second and a third inlet port, said first and second inlet ports connectable to a first passage opening into said first region and said third inlet port comunicable with a second passage communicable with said second region.

15. The apparatus of claim 14, wherein a wafer is located within said first region during the processing thereof in the chamber.

16. The apparatus of claim 14, further including valving connected to said inlet ports and configured to enable gas flow through said third port while preventing gas flow through said first and second ports.

17. The apparatus of claim 14, further including an insert plate extending through the wall of said chamber, said insert plate having three passages extending therethrough, each of said passages being connected to a separate one of said inlet ports.

18. The apparatus of claim 17, further comprising a liner seated against the inner surface of said wall of said chamber and extending across a surface of said insert plate, said liner having separate passages extending therethrough opening into each of the passages in the insert plate, one of the passages in the liner opening into said second region and the other passages in said liner opening into said first region.

19. The apparatus of claim 18, further including a cap plate intermediate said manifold and said insert plate, said cap plate a surface facing the surface of said insert plate, a plurality of recesses in said cap plate surface with each recess being opposed and opening to a separate one of said passages in said insert plate, each of said inlet ports being connected to a separate one of said recesses in said cap.

20. The apparatus of claim 14, further including a gas supply connected to said inlet ports to provide the same deposition gas to each of said inlet ports.

21. The apparatus of claim 20, wherein the gas supply includes a plurality of gas sources, each of which gas source is ported to each of said inlet ports.

22. The apparatus of claim 21, further including a common line, a first line extending from said common line to said third inlet port and a second line extending from said common line to said first port and said second port; and a valve disposed in each of said first line and said second line to selectively enable gas flow through said lines and into said ports.

* * * * *